(12) United States Patent
Cousin

(10) Patent No.: US 7,961,478 B2
(45) Date of Patent: Jun. 14, 2011

(54) INTEGRATED CIRCUIT, AND A MOBILE PHONE HAVING THE INTEGRATED CIRCUIT

(75) Inventor: Alain Cousin, Caen (FR)

(73) Assignee: NXP B.V., Eindhoven (NL)

( * ) Notice: Subject to any disclaimer, the term of this patent is extended or adjusted under 35 U.S.C. 154(b) by 855 days.

(21) Appl. No.: 11/578,502

(22) PCT Filed: Apr. 4, 2005

(86) PCT No.: PCT/IB2005/051110
§ 371 (c)(1),
(2), (4) Date: Oct. 12, 2006

(87) PCT Pub. No.: WO2005/101502
PCT Pub. Date: Oct. 27, 2005

(65) Prior Publication Data
US 2007/0274058 A1 Nov. 29, 2007

(30) Foreign Application Priority Data

Apr. 16, 2004 (EP) .................... 04300207

(51) Int. Cl.
*H05K 7/02* (2006.01)
*H05K 7/06* (2006.01)
*H05K 7/08* (2006.01)
*H05K 7/10* (2006.01)

(52) U.S. Cl. .......... 361/760; 361/770; 361/774
(58) Field of Classification Search .......... 174/520–523; 361/770–774, 790, 767
See application file for complete search history.

(56) References Cited

U.S. PATENT DOCUMENTS

| | | | | |
|---|---|---|---|---|
| 5,802,458 | A * | 9/1998 | Van Zeijl et al. | 455/575.5 |
| 5,903,049 | A * | 5/1999 | Mori | 257/686 |
| 6,329,739 | B1 | 12/2001 | Sawano | |
| 6,472,741 | B1 * | 10/2002 | Chen et al. | 257/712 |
| 6,734,605 | B2 * | 5/2004 | Kinoshita | 310/348 |
| 6,737,750 | B1 * | 5/2004 | Hoffman et al. | 257/777 |
| 6,787,916 | B2 * | 9/2004 | Halahan | 257/777 |
| 7,064,426 | B2 * | 6/2006 | Karnezos | 257/686 |
| 7,163,842 | B2 * | 1/2007 | Karnezos | 438/108 |
| 7,242,101 | B2 * | 7/2007 | Ararao et al. | 257/784 |
| 2002/0135269 | A1 | 9/2002 | Kinoshita | |
| 2003/0169575 | A1 | 9/2003 | Ikuta et al. | |
| 2004/0029356 | A1 | 2/2004 | Timme et al. | |
| 2004/0232802 | A1 | 11/2004 | Koshido | |

FOREIGN PATENT DOCUMENTS

EP 1 184 979 3/2002
WO WO 2004/012331 2/2004

* cited by examiner

*Primary Examiner* — Tuan T Dinh

(57) ABSTRACT

In an example embodiment, an integrated circuit comprises an on-chip electronic component. The on-chip electronic component has an active surface in a hermetically sealed cavity and a cover to hermetically seal the cavity. There is an additional electronic component wherein the additional electronic component is fixed on the cover.

10 Claims, 3 Drawing Sheets

INTEGRATED CIRCUIT, AND A MOBILE PHONE HAVING THE INTEGRATED CIRCUIT

FIELD OF THE INVENTION

The present invention relates to an integrated circuit, a method and an assembly for manufacturing the integrated circuit and a mobile phone having the integrated circuit.

BACKGROUND OF THE INVENTION

The known integrated circuits comprise:
an on-chip electronic component having an active surface in a hermetically sealed cavity and a cover to hermetically seal the cavity, and
an additional electronic component.

Hereinafter, the term "on-chip electronic component" is understood to mean an electronic component, which is manufactured on the die or chip of the integrated circuit.

Such integrated circuits are used, for example, in mobile phones. In mobile phones, the on-chip electronic component has an active surface within a hermetically sealed cavity and can be, for example, a SAW (Surface Acoustic Wave) filter.

The on-chip electronic component is connected to other electronic components to form an electronic circuit. Hereinafter, electronic components are understood to mean electronic components, which perform a specific function and influence the behaviour of the electronic circuit. Typically, electronic components are classified into active and passive components.

Active components include at least two inputs for receiving energy. The energy received by one of these inputs is used to control the energy received by the other input. Such active components are, for example, capable of controlling a voltage or a current to produce a gain or a switching action in the electronic circuit. Examples include transistors and the like.

On the other hand, passive components include only one input for receiving energy and for modifying the received energy. Such passive components are, for example, coils, resistors, capacitors, transmission lines constructive lines and the like.

It is desirable to integrate as many electronic components as possible in a single integrated circuit without increasing its size.

SUMMARY OF THE INVENTION

Accordingly, it is an object of the invention to miniaturize an integrated circuit having an on-chip electronic component with an active surface within an hermetically sealed cavity.

The invention provides an integrated circuit wherein the additional electronic component is fixed on the cover.

In the above integrated circuit, the cover is used as a hermetically sealing cover for the active surface as well as a substrate for fixing an additional electronic component. Therefore, the size of the chip used to manufacture the integrated circuit is reduced since there are no additional electric components on the surface of the integrated circuit chip.

An integrated circuit wherein the additional electronic component is manufactured on a surface of the cover, the cover comprising a substrate for manufacturing the additional electronic component, provides the advantage of reducing the manufacturing cost of integrated circuits.

An integrated circuit wherein the surface of the cover comprises an outside surface and an inside surface, wherein the inside surface is in contact with the cavity and the outside surface is opposite the inside surface, and the additional electronic component is manufactured on the outside surface of the cover, has the further advantage of simplifying the manufacturing process of the cover.

An integrated circuit wherein
the on-chip electronic component comprises a top surface having the active surface and connection pad located next to the active surface to connect the on-chip electronic component to the additional electronic component,
the cover is adapted to cover the active surface while leaving the connection pad uncovered, and
the integrated circuit further comprises a wire to directly connect the additional electronic component to the connection pad,
has the further advantage of reducing the sensitivity to noise of the integrated circuit.

An integrated circuit wherein the integrated circuit further comprises an on-chip transceiver adapted to receive or transmit a radio signal, has the advantage of making the integrated circuit suitable for a radio transceiver.

The invention also relates to an assembly to be used in an integrated circuit as mentioned above.

The invention further relates to a mobile phone comprising an integrated circuit as mentioned above.

The invention also relates to a method comprising the step of:
manufacturing an integrated circuit comprising an on-chip electronic component having an active surface within an hermetically sealed cavity and a cover to hermetically seal the cavity; and
wherein the method comprises the step of
fixing an additional electronic component on the cover.

Other features of the claimed invention are recited in the dependent claims.

These and other aspects of the invention will be apparent from the following description, drawings and claims.

DESCRIPTION OF THE PREFERRED EMBODIMENTS

Figure 1:
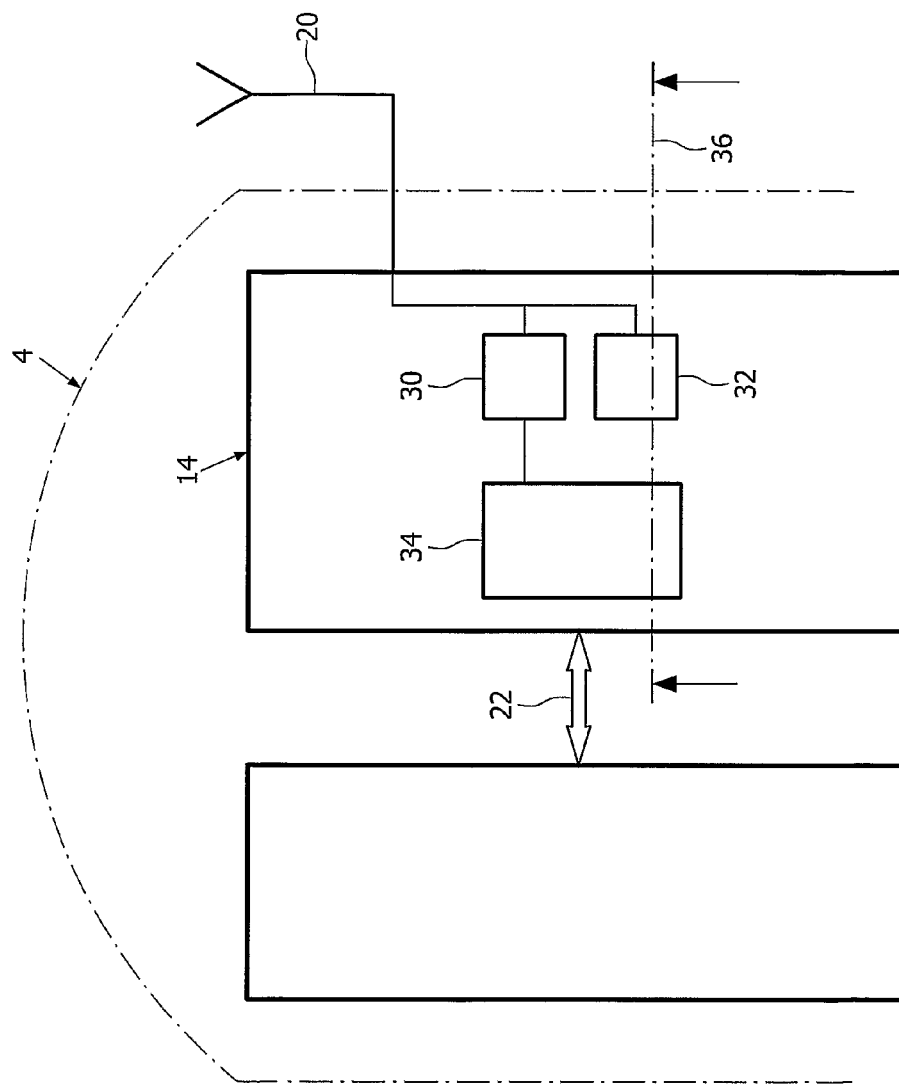
FIG. 1 is a schematic diagram of a mobile phone incorporating an integrated circuit according to the invention.

FIG. 1 shows a part of a radio telecommunication telephone. As an illustration, the radio telecommunication apparatus is a GSM (Global System for Mobile Communication) cellular mobile radio phone 4. Phone 4 is able to communicate with a base station of a cellular radio phone network using radio signals.

FIG. 1 shows only the details necessary to understand the invention.

To receive or transmit radio signals, phone 4 comprises a tunable radio transceiver 14 (hereinafter referred to as "integrated circuit 14") and a baseband processor 18.

Integrated circuit 14 is connected to an antenna 20 to receive and transmit radio signals.

Integrated circuit 14 is able to convert radio signals into baseband signals and vice versa. In other words, the main task of integrated circuit 14 is to remove a carrier from radio signals or to add the carrier to baseband signals.

Baseband signals are exchanged between processor 18 and integrated circuit 14 through a bus 22 that connects integrated circuit 14 to processor 18.

Processor 18 processes baseband signals in a conventional way.

Integrated circuit 14 is an integrated circuit comprising three on-chip electronic components, that is two SAW filters 30 and 32 and a transceiver circuit 34.

Filters 30 and 32 are connected to antenna 20 and transceiver circuit 34. More precisely, filter 30 is adapted to filter received radio signals and filter 32 is adapted to filter transmitted radio signals.

Figure 2:
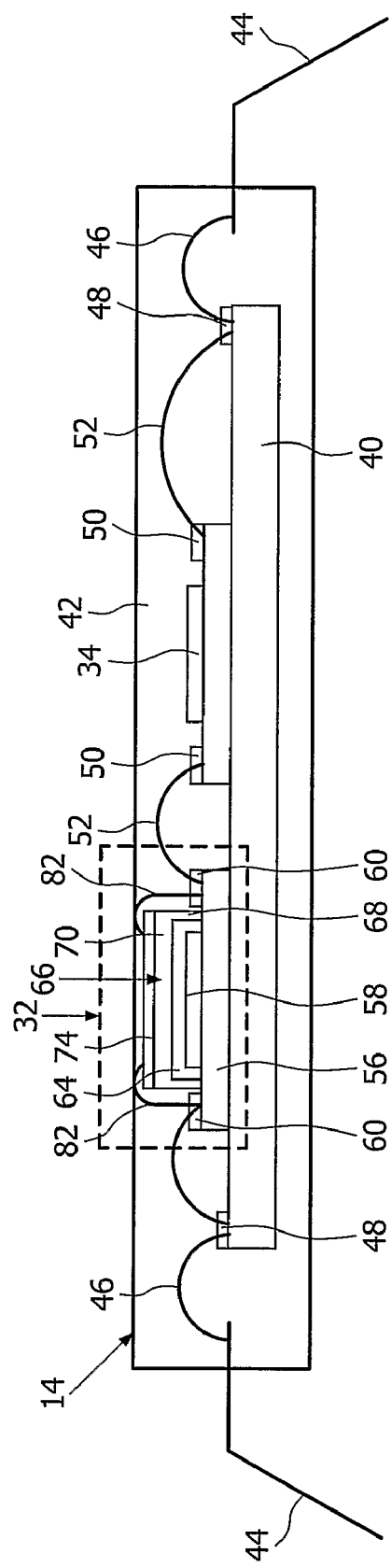
FIG. 2 is a cross-section of an integrated circuit according to the invention.

FIG. 2 shows a cross-section of integrated circuit 14 along a line 36 (FIG. 1) and shows only the details necessary to understand the invention.

Integrated circuit 14 comprises a horizontal semi-conductor die or chip 40 within a package assembly 42.

Semi-conductor die 40 is connected to package leads 44 via bond, wires 46. Each bond wire is connected at one end to package leads 44 and at the other end to bond pads 48.

Die 40 is a substrate used to manufacture on-chip electronic components like transceiver circuit 34 and filter 32. For instance, die 40 is a silicon substrate.

Circuit 34 includes bond pads 50 to connect circuit 34 to bond pad 48 and filter 32. The connection between circuit 34 and bond pad 48 is made using bond wire 52, and the connection between circuit 34 and filter 32 is made via another bond wire 52.

Filter 32 includes a horizontal piezo-electric element 56 manufactured on top of die 40. The upper surface of element 56 is an active surface 58 surrounded by bond pads 60.

For example, active surface 58 is positioned at the center of the upper surface of element 56. In the case of a SAW filter, the active surface 58 comprises conventional comb-type electrodes. These comb-type electrodes are connected to corresponding bond pads 60.

Active surface 58 is housed within a cavity 64, which is in contact with a clean inert gas such as air.

A cover 66 hermetically seals the cavity 64. Cover 66 is made of vertical walls 68 that surround active surface 58 and support a horizontal rectangular flat roof 70. Preferably, cover 66 is made from a piece of silicon.

For example, roof 70 has a 1.5 mm$^2$ square top outer surface located at a distance of 150 micrometers above active surface 58. The height of cavity 64 ranges from 20 to 30 micrometers above active surface 58.

An additional electronic component 74 (hereinafter referred to as "coil 74") is manufactured on the outside top surface of roof 70. Coil 74 is shown as an impedance matching coil that matches the impedance of filter 32 with the impedance of circuit 34. Cover 66 and coil 74 fixed on it, form an assembly.

Figure 3:
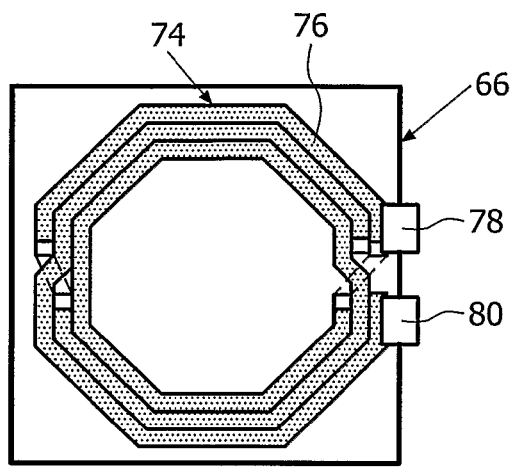
FIG. 3 is a top view of a cover used in the integrated circuit of FIG. 2.

FIG. 3 shows a top view of coil 74. Coil 74 is made from a coil-shaped strip line 76 and two connection pads 78 and 80. Pad 78 is connected to one end of line 76 and pad 80 is connected to the other end of line 76. The number of turns of line 76 determines a predetermined impedance value. Preferably, the impedance value of coil 74 ranges from 0.5 to 5 nH.

Pads 78 and 80 are connected to respective pads 60 using down bond wires 82 (FIG. 2). Thus coil 74 is connected in parallel between two outputs of filter 32.

Figure 4:
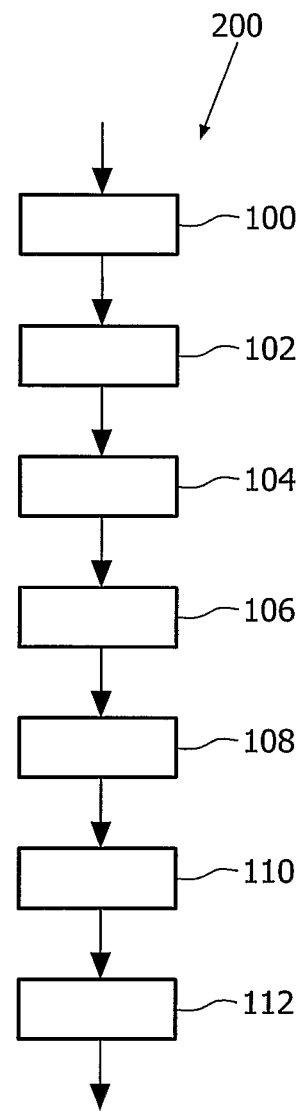
FIG. 4 is a flow chart of a method of manufacturing the integrated circuit of FIG. 2.

The manufacturing process 200 of cover 66 will be explained with reference to FIG. 4.

In step 100, cover 66 is manufactured using a conventional method.

Thereafter, cover 66 is used as a substrate to manufacture coil 74 on the top surface of roof 70 using, for example, a conventional metallization process.

More precisely, in step 102, deposition of a first metal is carried out on the top surface of roof 70. The first metal is aluminum, for example.

Then, in step 104, dry or wet etching of the first metal layer is carried out to form the first stage of line 76.

Subsequently, in step 106, a first insulating layer is produced to cover the first metal layer.

In step 108, a second metal layer is deposited on top of the first insulating layer.

Subsequently, in step 110, dry or wet etching of the second metal layer is carried out to form the second stage of line 76, as well as pads 78 and 80.

Finally, in step 112, a second insulating layer is produced on top of the second metal layer.

Due to the fact that coil 74 is manufactured on top of cover 66, the surface of die 40 is reduced by 1.5 mm$^2$. The package assembly used to incapsulate die 40 is also reduced.

Because pads 60 are on the top surface of element 56, wires 82 are short. Thus, wires 82 are less sensitive to electromagnetic noise and the integrated circuit 14 is more reliable.

Many additional embodiments are possible. For example, other passive or active components can be manufactured in cover 66. Examples of other passive components are capacitors or resistors. It is also possible to manufacture active components such as transistors in cover 66.

Furthermore, the additional electronic component can be manufactured on an inside surface of roof 70, which is in contact with cavity 64. Such an embodiment results in a shorter electrical connection between the additional electronic component and the SAW filter.

The invention applies to every component, that comprises a cover such as cover 66 to hermetically seal a cavity. For example, the invention also applies to BAW (Bulk Acoustic Wave) filter, MEMS (Micro Electro-Mechanical Systems) such as micro-interruptors and so on.

The additional electronic component can be manufactured independently from the cover and then be added and adhered to the cover.

One or more additional electronic components can be fixed, e.g adhered to or manufactured on a single cover.

The invention claimed is:

1. An integrated circuit comprising:
   an on-chip electronic component having a top surface having an active portion and a connection pad located next to the active portion, the active surface portion in a hermetically sealed cavity and a cover to hermetically seal the cavity,
   the cover configured and arranged to cover the active portion while leaving the connection pad uncovered,
   an additional electronic component fixed on the cover, and wires directly connecting the additional electronic component to the connection pad; and wherein the additional electronic component is secured on a surface of the cover, the cover comprising a substrate for securing the additional electronic component.

2. The integrated circuit according to claim 1, wherein the surface of the cover comprises an outside surface and an inside surface, the inside surface is facing the cavity and the outside surface is opposite the inside surface, the additional electronic component is secured on the outside surface of the cover.

3. The integrated circuit according to claim 1, wherein the integrated circuit further comprises an on-chip transceiver adapted to receive or transmit a radio signal.

4. The integrated circuit according to claim 1, wherein the additional electronic component is a coil having a flat coil-shaped conductive line having an impedance value.

5. An assembly adapted to be used in an integrated circuit according to claim 1, comprising the additional electronic component and the cover to hermetically seal the cavity, wherein the additional electronic component is fixed on the cover.

6. A mobile phone comprising an integrated circuit according to claim 3.

7. An integrated circuit comprising:
a semiconductor substrate;
a filter circuit including
  a piezo-electric element having a top surface and a bottom surface, the bottom surface in contact with the semiconductor substrate,
  electrically conductive filter elements on the top surface of the piezo-electric element, and
  a filter connection pad electrically connected to the conductive filter elements;
a cover that forms a hermetically sealed cavity between the conductive filter elements and the cover, the cover leaving at least a portion of the connection pad uncovered;
an inert gas that fills the cavity;
an antenna coil on the cover;
an antenna connection pad electrically connected to the antenna coil and located on the cover; and
a bond wire having a first end in contact with the antenna connection pad and a second end in contact with the filter connection pad.

8. The integrated circuit of claim 7, further including a wireless transceiver circuit on the semiconductor substrate, a transceiver connection pad and a bond wire with a first end contacting the filter connection pad and a second end contacting the transceiver connection pad.

9. The integrated circuit of claim 7, wherein, between the cover and the electrically conductive filter elements, the sealed cavity is 20 to 30 micrometers in width.

10. The integrated circuit of claim 7, wherein the cover is made from silicon.

* * * * *